(12) United States Patent
Luo et al.

(10) Patent No.: US 11,902,015 B2
(45) Date of Patent: Feb. 13, 2024

(54) MULTI-CHANNEL SIGNAL SYNCHRONIZATION SYSTEM, CIRCUIT, AND METHOD

(71) Applicant: RIGOL TECHNOLOGIES CO., LTD., Jiangsu (CN)

(72) Inventors: Junzhou Luo, Suzhou (CN); Chaomin Fang, Suzhou (CN); Bo Yan, Suzhou (CN); Yue Wang, Suzhou (CN); Tiejun Wang, Suzhou (CN); Weisen Li, Suzhou (CN)

(73) Assignee: RIGOL TECHNOLOGIES CO., LTD., Jiangsu (CN)

( * ) Notice: Subject to any disclaimer, the term of this patent is extended or adjusted under 35 U.S.C. 154(b) by 0 days.

(21) Appl. No.: 17/966,133

(22) Filed: Oct. 14, 2022

(65) Prior Publication Data
US 2023/0032250 A1 Feb. 2, 2023

Related U.S. Application Data

(63) Continuation of application No. PCT/CN2021/087347, filed on Apr. 15, 2021.

(30) Foreign Application Priority Data

Apr. 21, 2020 (CN) .......................... 202010315258.6

(51) Int. Cl.
*H04J 3/06* (2006.01)
(52) U.S. Cl.
CPC .................................. *H04J 3/0638* (2013.01)
(58) Field of Classification Search
CPC .... H04N 21/242; H04J 3/0644; H04J 3/0641; H04J 3/0667; H04J 3/0676; H04J 3/0638;
(Continued)

(56) References Cited

U.S. PATENT DOCUMENTS

| 7,593,497 B2 | 9/2009 | Conner |
| 8,819,472 B1 | 8/2014 | Muscha et al. |

(Continued)

FOREIGN PATENT DOCUMENTS

| CN | 1455898 A | 11/2003 |
| CN | 102129269 A | 7/2011 |

(Continued)

OTHER PUBLICATIONS

Chinese Office Action listed in Application No. 202010315258.6, dated Jun. 6, 2022.

(Continued)

*Primary Examiner* — Jung Liu
(74) *Attorney, Agent, or Firm* — Birch, Stewart, Kolasch & Birch, LLP

(57) ABSTRACT

Embodiments of the present application provide a multi-channel signal synchronization system, circuit, and method. The multi-channel signal synchronization system comprises a clock signal generation module, a synchronization signal generation module, and signal receiving modules; the clock signal generation module is configured to generate a first clock signal; the synchronization signal generation module is configured to generate a synchronization signal based on the first clock signal and transmit the synchronization signal to the clock signal generation module; the clock signal generation module generates second clock signals on the basis of the synchronization signal and transmits the second clock signals to the signal receiving modules; the synchronization signal generation module transmits the synchronization signal to the signal receiving modules.

10 Claims, 9 Drawing Sheets

(58) Field of Classification Search
CPC ......... H03L 7/087; H03L 7/06; H03K 5/1508; H04L 7/02
See application file for complete search history.

(56) References Cited

U.S. PATENT DOCUMENTS

| | | | |
|---|---|---|---|
| 2003/0035502 A1 | 2/2003 | Boerker | |
| 2006/0182212 A1 | 8/2006 | Hwang et al. | |
| 2006/0261870 A1* | 11/2006 | Hayashida | H03L 7/099 327/158 |
| 2016/0142066 A1 | 5/2016 | Balasubramanian et al. | |
| 2018/0062780 A1* | 3/2018 | Shimizu | H04N 21/242 |
| 2018/0102779 A1* | 4/2018 | Behel | H03L 7/087 |
| 2019/0007055 A1* | 1/2019 | Nelson | G06F 1/12 |
| 2020/0003862 A1* | 1/2020 | Doaré | H04L 7/065 |

FOREIGN PATENT DOCUMENTS

| | | |
|---|---|---|
| CN | 103364602 A | 10/2013 |
| CN | 104767607 A | 7/2015 |
| CN | 103364602 B | 10/2017 |
| CN | 111510277 A | 8/2020 |
| JP | 2008-21055 A | 1/2008 |
| JP | 2013-450 A | 1/2013 |

OTHER PUBLICATIONS

International Search Report (PCT/ISA/210) issued in PCT/CN2021/087347, dated Jul. 7, 2021.
Written Opinion of the International Searching Authority (PCT/ISA/237) issued in PCT/CN2021/087347, dated Jul. 7, 2021.
Ali et al., "An Ultra Low Power, 3-Wire Serial Interface Design for Data Converters in Pin-Constrainted Applications with 180 nm CMOS Technology," 2017 International Conference on Frontiers of Information Technology, 2017, pp. 104-109.
Xie et al., "Application of Synchronous Acquisition Technology Based on JESD204B Protocol in Phased Array Radar," 2018 11th International Congress on Image and Signal Processing, BioMedical Engineering and Informatics (CISP-BMEI 2018), 2018, pp. 1-5.

* cited by examiner

MULTI-CHANNEL SIGNAL SYNCHRONIZATION SYSTEM, CIRCUIT, AND METHOD

CROSS-REFERENCE TO RELATED APPLICATIONS

The present disclosure is a Continuation Application of International Application No. PCT/CN2021/087347, filed on Apr. 15, 2021, which claims priority to the Chinese Patent Application No. 202010315258.6 filed on Apr. 21, 2020 to the China National Intellectual Property Administration, the entire contents of each of which are incorporated herein by reference.

TECHNICAL FIELD

Embodiments of the present application relate to the technical field of signal, for example, a multi-channel signal synchronization system, circuit, and method.

BACKGROUND

In the field of communication, a clock signal is the basis for a circuit with sequential logic to perform corresponding operations. In some multi-channel systems, it is necessary to transmit clock signals to elements corresponding to multiple channels in the system, so that the multi-channel system can implement a corresponding operation of the system based on the corresponding clock signal. For example, a clock signal may be generated and output to an analog-to-digital converter corresponding to each channel to enable data acquisition. Accordingly, in order to ensure the normal operation of the above-mentioned system, it is also necessary to use a synchronization signal to synchronize the counts corresponding to the clock signals in different channels. However, the synchronization operation may fail.

SUMMARY

It is an object of the embodiments of the present application to provide a multi-channel signal synchronization system, circuit, and method to solve the problem of how to conveniently and efficiently achieve signal synchronization in a multi-channel system.

An embodiment of the present application provides a multi-channel signal synchronization system, including a clock signal generation module, a synchronization signal generation module, and at least two signal receiving modules, wherein
  the clock signal generation module is configured to generate a first clock signal and transmit the first clock signal to the synchronization signal generation module;
  the synchronization signal generation module is configured to generate a synchronization signal based on the first clock signal output by the clock signal generation module, and transmit the synchronization signal to the clock signal generation module;
  the clock signal generation module is further configured to generate a second clock signal based on the synchronization signal fed back by the synchronization signal generation module, and transmit the second clock signal to the at least two signal receiving modules; and
  the synchronization signal generation module is further configured to transmit the synchronization signal to the at least two signal receiving modules.

An embodiment of the present application provides a multi-channel signal synchronization system, including a clock signal generation module, a synchronization signal generation module, and at least two signal receiving modules, wherein
  the clock signal generation module is configured to generate a first clock signal and transmit the first clock signal to the synchronization signal generation module;
  the synchronization signal generation module is configured to generate a synchronization signal based on the first clock signal output by the clock signal generation module, and transmit the synchronization signal to the clock signal generation module; and
  the clock signal generation module is further configured to generate a second clock signal based on the synchronization signal fed back by the synchronization signal generation module, and to transmit the synchronization signal and the second clock signal to the at least two signal receiving modules.

An embodiment of the present application provides a multi-channel signal synchronization circuit, including a clock signal generation module, a synchronization signal generation module, and a signal output port, wherein
  a first clock signal transmission branch and a synchronization signal transmission first branch are provided between the clock signal generation module and the synchronization signal generation module, wherein the first clock signal transmission branch is configured to transmit a first clock signal to the synchronization signal generation module by the clock signal generation module, and the synchronization signal transmission first branch is configured to transmit a synchronization signal to the clock signal generation module by the synchronization signal generation module; and the synchronization signal generation module is configured to generate the synchronization signal based on a received first clock signal;
  a second clock signal transmission branch is provided between the clock signal generation module and the signal output port, wherein the second clock signal transmission branch is configured to transmit a second clock signal to the signal output port by the clock signal generation module, and the clock signal generation module is configured to generate the second clock signal based on a received synchronization signal and the first clock signal; and
  a synchronization signal transmission second branch is provided between the synchronization signal generation module and the signal output port, wherein the synchronization signal transmission second branch is configured to transmit the synchronization signal to the signal output port by the synchronization signal generation module.

An embodiment of the present application provides a multi-channel signal synchronization circuit, including a clock signal generation module, a synchronization signal generation module, and a signal output port, wherein
  a first clock signal transmission branch and a synchronization signal transmission branch are provided between the clock signal generation module and the synchronization signal generation module, wherein the first clock signal transmission branch is configured to transmit a first clock signal to the synchronization signal generation module by the clock signal generation module, and the synchronization signal transmission branch is configured to transmit a synchronization signal to the clock signal generation module by the synchronization signal generation module; and the synchronization signal generation module is configured to generate the synchronization signal based on the received first clock signal; and a mixed signal transmission branch is provided between the clock signal generation module and the signal output port, wherein the mixed signal transmission branch is configured to transmit a second clock signal and the synchronization signal to the signal output port by the clock signal generation module; and the clock signal generation module is configured to generate the second clock signal based on the received synchronization signal.

An embodiment of the present application provides a multi-channel signal synchronization method, including:

generating, by a clock signal generation module, a first clock signal, and outputting the first clock signal to a synchronization signal generation module;

generating, by the synchronization signal generation module, a synchronization signal based on the first clock signal, and transmitting the synchronization signal to the clock signal generation module;

generating, by the clock signal generation module, a second clock signal based on the synchronization signal, and transmitting the second clock signal to at least two signal receiving modules; and transmitting, by the synchronization signal generation module, the synchronization signal to the at least two signal receiving modules to achieve synchronization of the at least two signal receiving modules.

An embodiment of the present application provides a multi-channel signal synchronization method, including:

generating, by a clock signal generation module, a first clock signal, and outputting the first clock signal to a synchronization signal generation module;

generating, by the synchronization signal generation module, a synchronization signal based on the first clock signal, and transmitting the synchronization signal to the clock signal generation module;

generating, by the clock signal generation module, a second clock signal based on the synchronization signal; and transmitting, by the clock signal generation module, the synchronization signal and the second clock signal to at least two signal receiving modules to achieve synchronization of the at least two signal receiving modules.

BRIEF DESCRIPTION OF DRAWINGS

In order to describe the embodiments of the present application or the technical solution in the related art, the following will briefly introduce the drawings that need to be used in descriptions of the embodiments or the related art.

DETAILED DESCRIPTION

The technical solutions in the embodiments of the present application will be clearly and completely described with reference to the drawings in the embodiments of the present application. Herein, the singular can cover the plural unless stated otherwise.

In the related art, since clock signals received by different channels in a system may have different time delays, when a synchronization signal is input, the synchronization signal may not satisfy the requirements for setup time and hold time of a part of the clock signals, resulting in synchronization failure. Therefore, there is an urgent need for a means for conveniently and efficiently synchronizing a multi-channel system.

The multi-channel system refers to a system that needs to use a signal generation module to respectively transmit corresponding signals to other modules via multiple channels. For example, in a data sampling system, a plurality of analog-to-digital converters are often included to implement data sampling. A clock signal is often the basis for implementing a circuit with sequential logic, and it generally requires to transmit a corresponding clock signal to each channel. Accordingly, in order to ensure the normal operation of modules corresponding to each channel in the above-mentioned system, it is also necessary to use a synchronization signal to synchronize the counts corresponding to the clock signals in different modules. The synchronization of the modules corresponding to each channel in the system may be accomplished, for example, by clearing the counts in the register of each module via a synchronization signal.

Figure 1A:
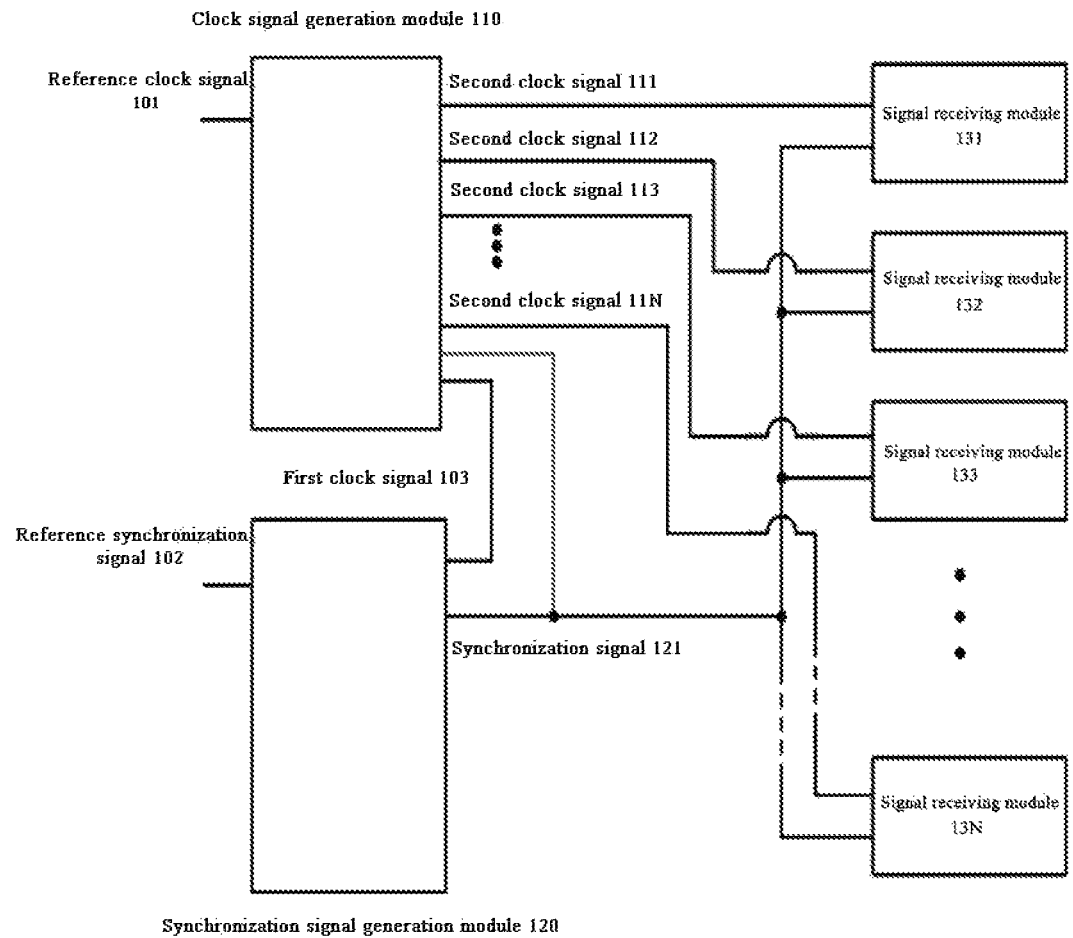
FIG. 1A is a schematic diagram of a multi-channel signal synchronization system according to an embodiment of the present application.

As shown in FIG. 1A, an embodiment of the present application proposes a multi-channel signal synchronization system. The multi-channel signal synchronization system includes a clock signal generation module 110, a synchronization signal generation module 120, and at least two signal receiving modules.

In an embodiment, a reference clock signal 101, and second clock signals 111, 112, 113 to 11N are recorded in FIG. 1A, where N represents a positive integer larger than 1, e.g., 11N may be 115. The signal receiving modules 131, 132, 133 to 13N are also recorded in FIG. 1A.

The clock signal generation module 110 may generate a first clock signal 103. The first clock signal 103 is a clock signal having a specific clock period. The clock signal generation module 110 may generate the first clock signal 103 by, for example, using an oscillator provided by itself.

In some implementation modes, the clock signal generation module 110 may receive a reference clock signal 101 as an input signal. The reference clock signal 101 is one clock signal. The clock signal generation module 110 may generate the first clock signal 103 according to the reference clock signal 101. In an embodiment, the clock signal generation module 110 may perform delay processing on the reference clock signal 101 to generate the first clock signal 103, or may adjust the clock period of the reference clock signal 101 to generate the first clock signal 103.

In some implementation modes, when the clock signal generation module 110 receives the reference clock signal 101 as the input signal, the reference clock signal 101 may be processed to obtain an intermediate clock signal. In an embodiment, for example, frequency division may be performed on the reference clock signal 101 to obtain the intermediate clock signal. After obtaining the intermediate clock signal, the first clock signal 103 may be obtained based on the intermediate clock signal. The particular clock period of the first clock signal 103 may be determined based on the period of the intermediate clock signal, e.g., the particular clock period of the first clock signal 103 may be determined under the case that the frequency of the first clock signal 103 is ensured to be an integer multiple of the intermediate clock signal. Based on this, it can be ensured that the signal edge of the synchronization signal 121 generated based on the first clock signal 103 is aligned with the signal edge of the intermediate clock signal, thereby facilitating data processing in subsequent steps.

After generating the first clock signal 103, the clock signal generation module 110 may transmit the first clock signal to the synchronization signal generation module 120 through a first clock signal transmission branch connected between the clock signal generation module 110 and the synchronization signal generation module 120.

After receiving the first clock signal 103, the synchronization signal generation module 120 may generate a synchronization signal 121 according to the first clock signal 103. The synchronization signal 121 is a signal having a valid signal segment of finite length. The synchronization signal 121 may be transmitted to each signal receiving module in the system, and the synchronization of each signal receiving module is achieved when the synchronization signal 121 is a valid signal segment. In an embodiment, the synchronization of each signal receiving module may be achieved, for example, by clearing the count in a register in each signal receiving module after a valid signal is input based on the synchronization signal 121. After the valid signal segment of the synchronization signal 121 passes, the system resumes the normal operation, and each signal receiving module executes the corresponding operation according to the clock signal.

In an embodiment, the synchronization signal generation module 120 may generate a synchronization signal 121 according to the clock period of the first clock signal 103. The clock period is the reciprocal of the signal frequency of the clock signal. In an embodiment, the clock period may also be the time from one rising edge to a next rising edge of the clock signal.

In an embodiment, the synchronization signal generation module 120 may receive the reference synchronization signal 102. To facilitate data processing in subsequent steps, the synchronization signal generation module 120 may process the reference synchronization signal 102 based on the first clock signal to obtain the synchronization signal 121. In an embodiment, the synchronization signal 121 may be obtained, for example, by aligning the edge of the reference synchronization signal 102 with the edge of the first clock signal. In practical applications, the reference synchronization signal 102 may be aligned with the rising edge of the first clock signal, or the reference synchronization signal 102 may be aligned with a falling edge of the first clock signal 103.

In an embodiment, when the synchronization signal generation module 120 generates the synchronization signal 121 according to the clock period of the first clock signal 103, the synchronization signal 121 is generated with a signal validity duration greater than or equal to twice the clock period. The signal validity duration is the duration of a corresponding signal segment when the synchronization signal 121 is active in the system. For example, when the synchronization signal 121 is valid at high level, the signal validity duration may be the duration for which the high level of the synchronization signal 121 lasts.

A synchronization signal transmission first branch (i.e., a first branch for synchronization signal transmission) is connected between the synchronization signal generation module 120 and each signal receiving module, so that the synchronization signal generation module 120 can transmit the synchronization signal 121 to each signal receiving module based on the synchronization signal transmission first branch, thereby achieving the synchronization of the signal receiving modules.

In the system corresponding to FIG. 1A, the synchronization signal transmission first branch and the first clock signal transmission branch are distinguished only by the function of each signal line. In practical applications, a same signal line can be used to realize the transmission of the first clock signal and the synchronization signal 121, and two signal lines also can be used to realize the transmission of the first clock signal and the synchronization signal 121.

After receiving the synchronization signal 121, the clock signal generation module 110 may generate a second clock signal based on the synchronization signal 121.

In an embodiment, the clock signal generation module 110 may generate the second clock signal by generating an intermediate clock signal according to the received reference clock signal 101 and generating the second clock signal according to the synchronization signal 121 and the intermediate clock signal.

In an embodiment, the clock signal generation module 110 may generate the second clock signal according to the synchronization signal 121 and the intermediate clock signal by inputting the synchronization signal 121 and the intermediate clock signal into a gating clock unit to obtain the second clock signal. The gating clock unit is set to turn off the output of the intermediate clock signal according to the synchronization signal 121, so as to obtain a clock signal with a duration of the low level being of the synchronization signal 121 as the second clock signal.

In an embodiment, the clock signal generation module 110 may delay the synchronization signal 121 and generate the second clock signal according to the delayed synchronization signal 121.

In practical applications, in order not to affect the normal waveform of the generated second clock signal, before generating the second clock signal by using the synchronization signal, the synchronization signal may be delayed first, and then the second clock signal is generated according to the delayed synchronization signal. In an embodiment, the synchronization signal may be delayed based on an edge of a next period of the first clock signal, and then the first clock signal may be delayed by using the delayed synchronization signal, and the edge of the next period of the first clock signal may be a rising edge or a falling edge.

In an embodiment, the next period of the second clock signal refers to a scenario where at the moment corresponding to a starting point of the high level of the synchronization signal 121, the period in which the second clock signal is located is taken as a current period of the second clock signal, and a next period of the current period is taken as the next period of the second clock signal.

The above-described process of generating the second clock signal is explained with reference to FIG. 1B. In an embodiment, in FIG. 1B, T100, T101, T102 to T111 represent different moments.

Assuming that the second clock signal 111 is a clock signal generated without delaying the intermediate clock signal, it can be seen that the starting point of the high level of the synchronization signal 121 just corresponds to the falling edge of the second clock signal 111, and then at the end of the next falling edge of the second clock signal 111, the second clock signal 111 is delayed so that the length of the duration of the low level from the falling edge of the next period of the second clock signal 111 to a next rising edge of the second clock signal 111 is equal to the time length of the duration $T_{sync}$ of the high level of the synchronization signal 121.

Figure 1B:
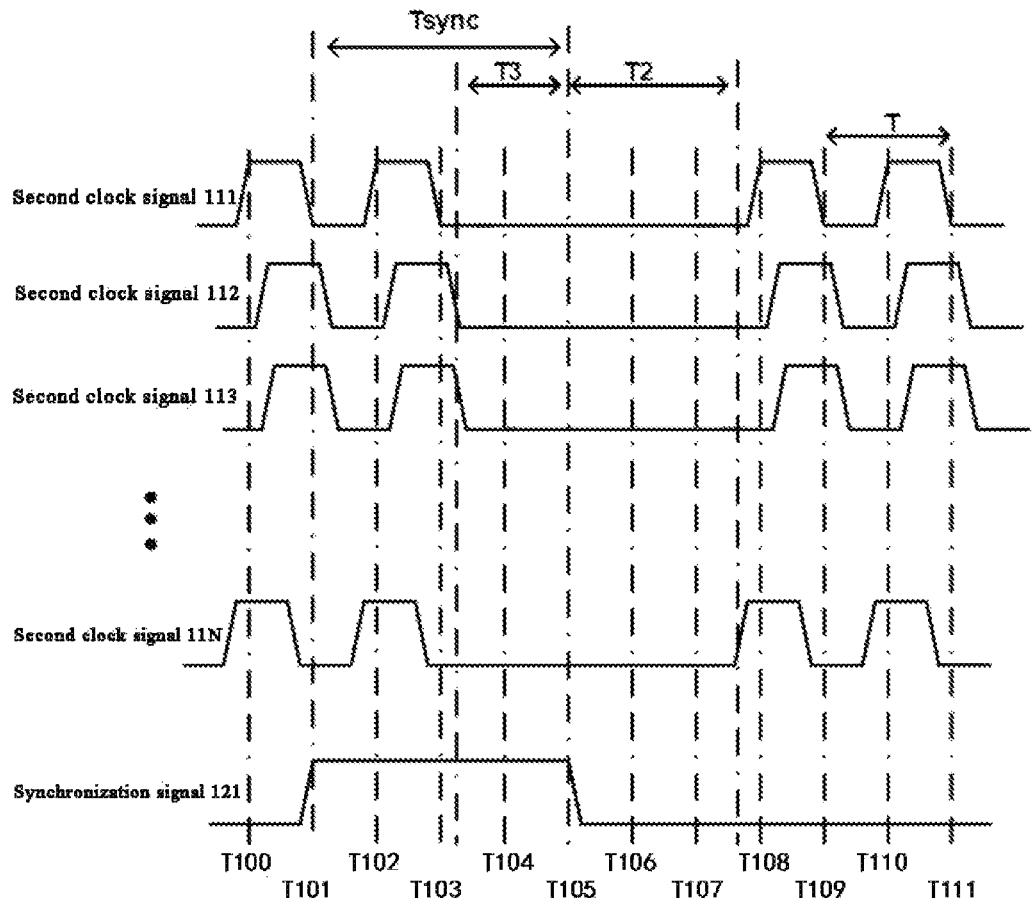
FIG. 1B is a schematic diagram of a signal synchronization sequence diagram according to an embodiment of the present application.

Based on FIG. 1B, the time between the ending point of the high level of the second clock signal and the ending point of the high level of the synchronization signal 121 is taken as T3, and the time between the ending point of the high level of the synchronization signal 121 and the starting point of the next rising edge of the second clock signal after the ending point of the high level of the synchronization signal 121 is taken as T2. The sum of the time lengths of T2 and T3 is the duration $T_{sync}$ of the high level of the synchronization signal 121. In the case where the duration $T_{sync}$ of the high level is greater than or equal to two clock periods T, the lengths of T2 and T3 are both greater than or equal to the clock period T. In the case where the length of T3 is greater than or equal to the clock period, the synchronization signal 121 will not be interfered by a valid clock signal within the time period corresponding to T3, so that the validity of the synchronization signal 121 is ensured. Therefore, the data corresponding to the synchronization signal 121 can be correctly read into the register of the signal receiving module. In the case where the length of T2 is greater than or equal to the clock period, not only is sufficient set-up time reserved for the clock signal, but also it can ensure that the clock signal will not be in a validity period of the high level after the high level of the synchronization signal 121 ends, thereby ensuring the synchronization of the signal in each signal receiving module, and avoiding the case where some signal receiving modules count in advance according to the clock signal.

One implementation mode of the clock signal generation module is introduced below in conjunction with FIG. 2. In the clock signal generation module, firstly, the synchronization signal 121 and the intermediate clock signal 212 can be input into a delay unit 201 to delay the synchronization signal 121, and then the delayed synchronization signal 121 is input into a gating clock circuit composed of a D type flip-flop DFF202 and a AND gate circuit AND203. After passing through the clock signal generation module, the intermediate clock signal will obtain a clock signal with a delay, so that the synchronization signal 121 and the intermediate clock signal 212 are combined to obtain the second clock signal.

Figure 2:
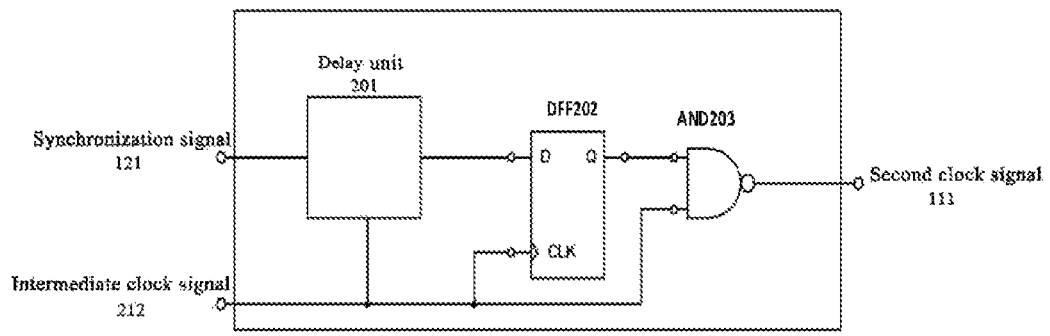
FIG. 2 is a schematic diagram of a clock signal generation module according to an embodiment of the present application.
Figure 3A:
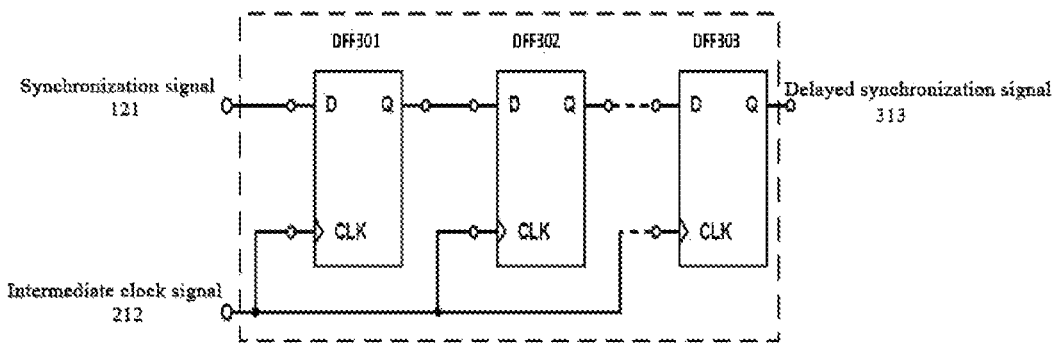
FIG. 3A is a schematic diagram of a delay unit according to an embodiment of the present application.

FIG. 3A is one specific implementation mode corresponding to the delay unit of FIG. 2. The delay unit is composed of a plurality of DFFs (delay flip-flop) to form one delay chain. Each DFF can delay the synchronization signal 121 by one clock period. A corresponding number of DFFs may be selected according to the delay requirement for the synchronization signal 121, thereby delaying the synchronization signal 121 by the corresponding time.

In an embodiment, in FIG. 3A, CLK represents a clock interface; DFF301, DFF302, and DFF303 represent DFF; and 313 represents the delayed synchronization signal.

In order to obtain a more accurate delay operation on the synchronization signal 121, the input intermediate clock signal 212 may be replaced with a clock signal having a small clock period, thereby obtaining a better delay effect.

Figure 3B:
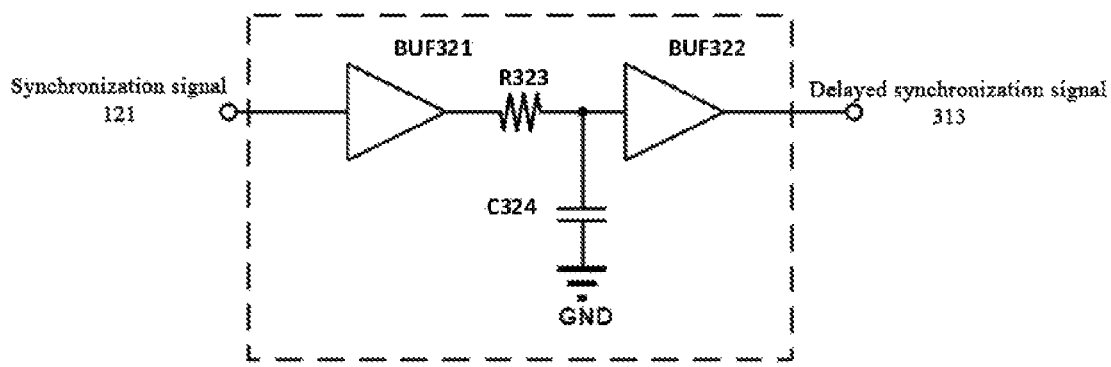
FIG. 3B is a schematic diagram of a delay unit according to an embodiment of the present application.

FIG. 3B is another implementation mode of a delay unit to delay the synchronization signal 121. In this implementation mode, BUF321 is a signal driving circuit and BUF322 is a waveform shaping circuit, and a RC delay unit can be obtained by combining these two circuits with a resistor R323 and a capacitor C324. After the synchronization signal 121 passes through the RC delay unit, delay processing can be performed on the synchronization signal 121. By adjusting parameters of the resistor and the capacitor, the delayed time length of the synchronization signal 121 can be adjusted accordingly, so as to meet the specific requirement for delaying the synchronization signal 121.

Figure 3C:
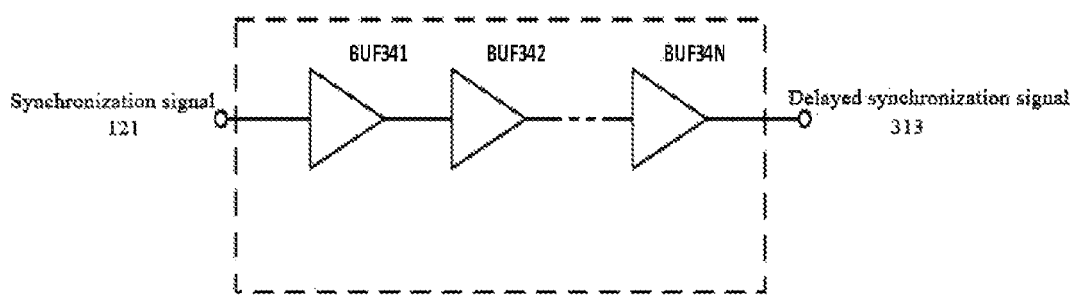
FIG. 3C is a schematic diagram of a delay unit according to an embodiment of the present application.

FIG. 3C is another implementation mode of a delay unit to delay the synchronization signal 121. The delay unit consists of several buffers (BUF). Since each BUF has a fixed delay length, a delay of a corresponding duration of the synchronization signal 121 can be realized after a plurality of BUFs are connected in series.

In an embodiment, in FIG. 3C, each of BUF341, BUF342, and BUF34N represents a BUF, wherein N is a positive integer, e.g., 345, 347, etc.

All the delay units described in the above embodiments can delay the synchronization signal 121.

In another implementation mode, the clock signal generation module 110 may also generate a second clock signal according to the reference clock signal 101 and the synchronization signal 121. A specific implementation process may refer to the above-mentioned process of generating the second clock signal by using the intermediate clock signal and the synchronization signal, which will not be described in detail herein.

An information line is connected between the clock signal generation module 110 and the signal receiving module, so that the clock signal generation module 110 can transmit the second clock signal to each signal receiving module via the information line. After receiving the second clock signal, the signal receiving module can implement the effective operation of the sequential circuit based on the second clock signal, so as to complete the corresponding data sampling work.

In practical applications, different requirements may exist for the clock signal in each signal receiving module. As shown in FIG. 1B, a certain delay also exists between different second clock signals, namely, different signal receiving modules may have different delay lengths correspondingly. In this case, after generating the second clock signal, the clock signal generation module 110 can perform corresponding delay processing on the second clock signal transmitted to different signal receiving modules, and specifically can perform delay processing on the second clock signal according to the delay lengths corresponding to the signal receiving modules. Accordingly, the clock signal generation module 110 transmits the delayed second clock signal to each signal receiving module, so as to satisfy different requirements of the signal receiving modules for a clock signal.

In an embodiment, after generating the second clock signal, the clock signal generation module 110 can directly transmit the second clock signal to the signal receiving modules respectively, and each signal receiving module performs delay processing on the second clock signal. The specific delay length can be determined according to the delay lengths corresponding to the different signal receiving modules.

Figure 4A:
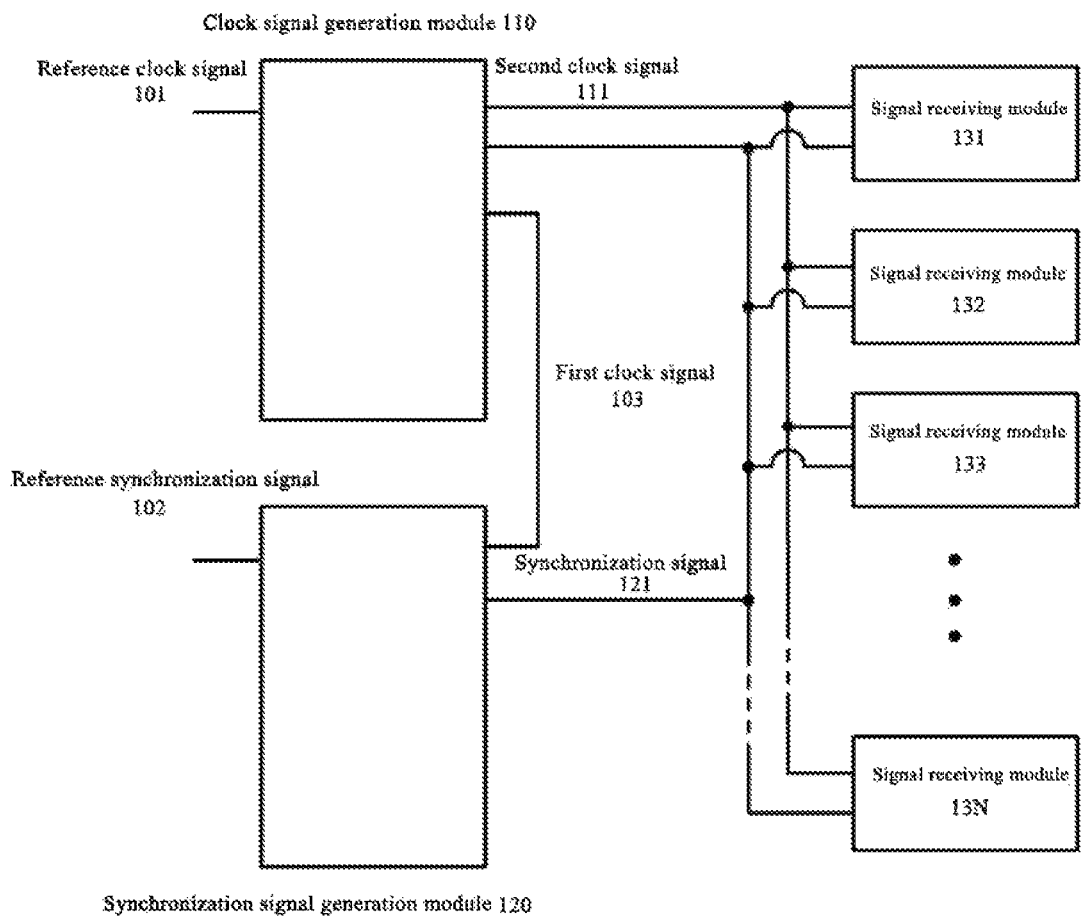
FIG. 4A is a schematic diagram of a multi-channel signal synchronization system according to an embodiment of the present application.

As shown in FIG. 4A, the second clock signal is delayed by the signal receiving modules. It can be seen that the signal transmitted by the clock signal generation module 110 to each signal receiving module is a same second clock signal, and each signal receiving module delays the second clock signal by itself.

Figure 4B:
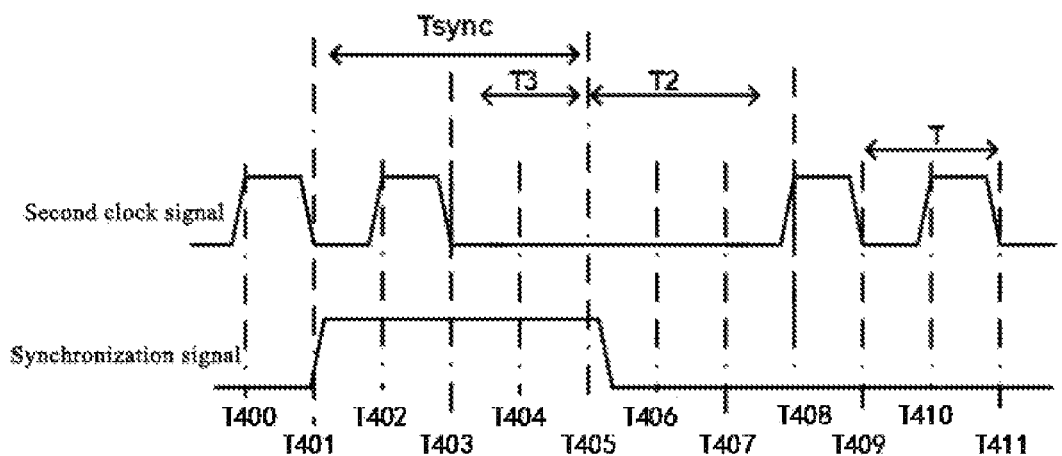
FIG. 4B is a schematic diagram of a signal synchronization sequence diagram according to an embodiment of the present application.

As shown in FIG. 4B, a sequential diagram between the second clock signal and the synchronization signal 121 in the implementation mode is shown. Specific features of the second clock signal and the synchronization signal 121 may be described with reference to the implementation mode corresponding to FIG. 1B, which will not be described in detail herein.

In an embodiment, in FIG. 4B, T400, T401, T402, and T411 represent different moments.

The signal receiving module is a module for performing operations such as data sampling or data operation based on the clock signal. For example, the signal receiving module may include an analog-to-digital converter. After receiving the synchronization signal 121, the signal receiving module may clear the count corresponding to its own register. In the case of transmitting the synchronization signal 121 to each signal receiving module, the synchronization of each signal receiving module can be realized.

Based on the above-mentioned multi-channel signal synchronization system, after the synchronization signal 121 is generated, the clock signal generation module 110 will generate a corresponding clock signal based on the synchronization signal 121, so as to ensure that synchronization signal 121 will not be interfered when synchronizing each signal receiving module, and ensure the normal operation of each signal receiving module after the synchronization. Further, in the case where a valid synchronization signal 121 is not generated, no deviation occurs to the second clock signal, thereby ensuring that the signal receiving module can perform the normal operation according to the second clock signal under a normal operation state. Therefore, the multi-channel signal synchronization system described above achieves convenient and effective synchronization of signal receiving modules in the system.

Figure 5:
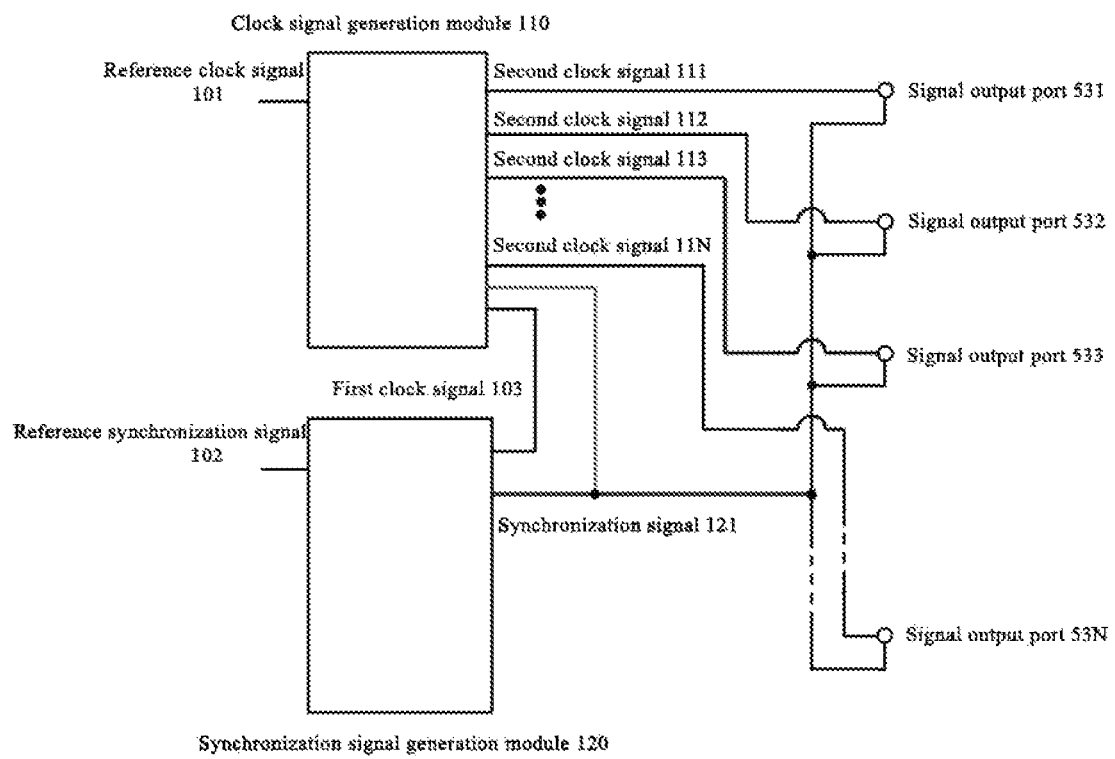
FIG. 5 is a schematic diagram of a multi-channel signal synchronization circuit according to an embodiment of the present application.

Based on the above-mentioned multi-channel signal synchronization system, as shown in FIG. 5, a multi-channel signal synchronization circuit according to an embodiment of the present application is introduced. The multi-channel signal synchronization circuit according to the embodiment can be applied to or included in the multi-channel signal synchronization system according to the embodiment corresponding to FIG. 1A. The multi-channel signal synchronization circuit includes a clock signal generation module 110, a synchronization signal generation module 120, and signal output ports, wherein the signal output port may be the signal receiving module described in the above embodiments, or each of the at least two signal receiving modules may include the signal output port.

In an embodiment, in FIG. 5, each of 531, 532, 533, and 53N represents a signal output port, where N is a positive integer, e.g., 534, 535, etc.

The introduction of the clock signal generation module 110, the synchronization signal generation module 120, and the signal output port may refer to the introduction of the clock signal generation module 110, the synchronization signal generation module 120, and the signal receiving module in the embodiment corresponding to FIG. 1A, which will not be described in detail herein.

The clock signal generation module may generate a first clock signal 103. A first clock signal transmission branch may be provided between the clock signal generation module 110 and the synchronization signal generation module 120 to enable the clock signal generation module 110 to transmit the first clock signal 103 to the synchronization signal generation module 120.

The generating process of the first clock signal 103 may refer to the introduction of generating the first clock signal 103 in the embodiment corresponding to FIG. 1A, which will not be described in detail herein.

A synchronization signal transmission first branch may also be provided between the clock signal generation module 110 and the synchronization signal generation module 120, so that the synchronization signal generation module 120 transmits the synchronization signal 121 to the clock signal generation module 110. The generating process of the synchronization signal 121 may refer to the introduction of generating the synchronization signal 121 in the embodiment corresponding to FIG. 1A, which will not be described in detail herein.

In an embodiment, the synchronization signal transmission first branch and the first clock signal transmission branch are merely distinguished from a functional point of view. In practical applications, the synchronization signal transmission first branch and the first clock signal transmission branch may be the same signal line or different signal lines.

After receiving the synchronization signal 121, the clock signal generation module 110 may generate the second clock signal based on the synchronization signal 121.

In an embodiment, the clock signal generation module 110 may generate the second clock signal by generating an intermediate clock signal based on the received reference clock signal 101 and generating the second clock signal based on the synchronization signal 121 and the intermediate clock signal.

The process of generating the second clock signal may refer to the introduction of generating the second clock signal in the corresponding embodiment of FIG. 1A, which will not be described in detail herein.

A second clock signal transmission branch may be provided between the clock signal generation module 110 and the signal output port, so that the clock signal generation module 110 transmits the second clock signal to the signal output port via the second clock signal transmission branch.

A synchronization signal transmission second branch (i.e., a second branch for synchronization signal transmission) may also be provided between the synchronization signal generation module 120 and the signal output port, so that the synchronization signal generation module 120 transmits the synchronization signal 121 to the signal output port via the synchronization signal transmission second branch.

The signal output port may transmit the second clock signal and the synchronization signal 121 to a module connected to the signal output port outside the circuit. For example, in the case where the signal output port is connected to an analog-to-digital converter, the second clock signal can be transmitted to the analog-to-digital converter to implement the normal data sampling operation of the analog-to-digital converter, the synchronization signal 121 may also be transmitted to the analog-to-digital converter via the signal output port to enable the synchronization of analog-to-digital converters corresponding to different signal output ports. In practical applications, any module that operates on the basis of a clock signal and needs to be synchronized may be connected to the signal output port.

Figure 6:
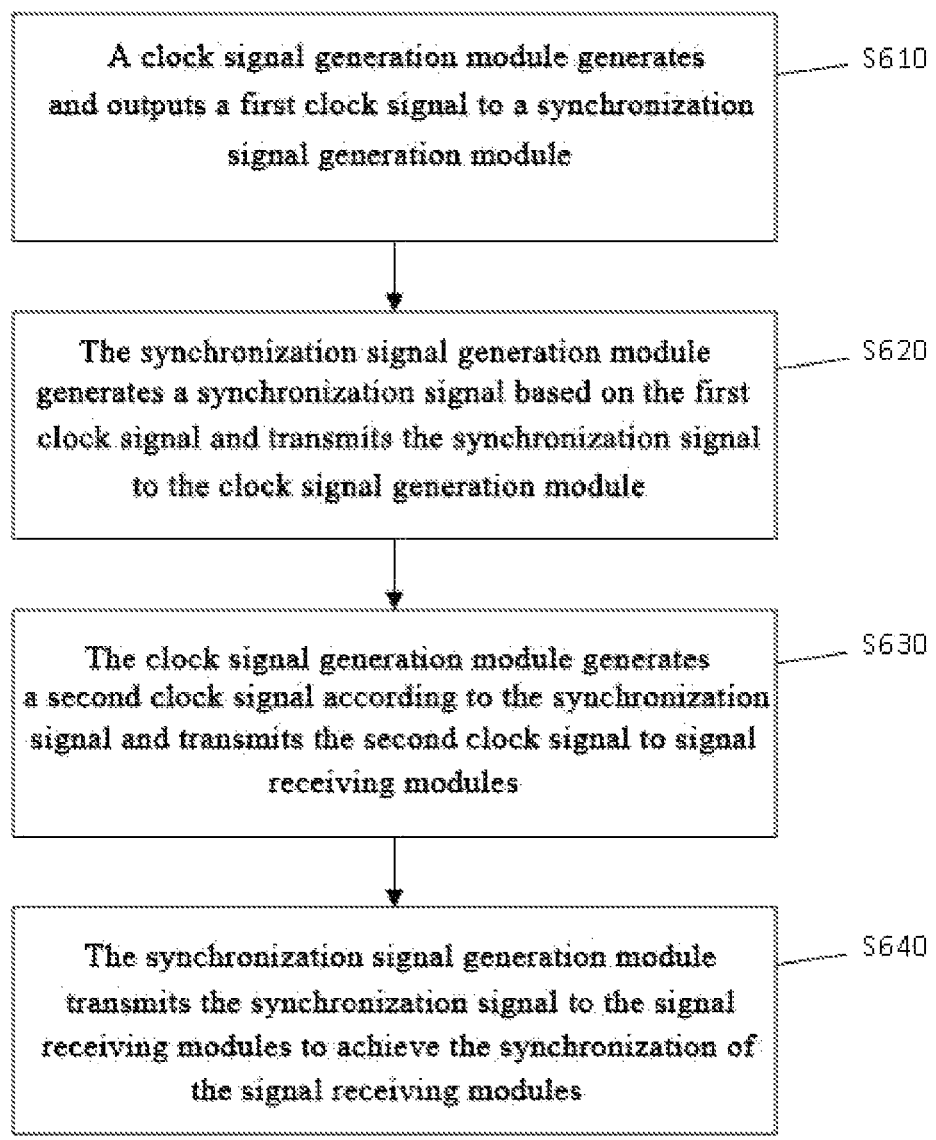
FIG. 6 is a flow chart of a multi-channel signal synchronization method according to an embodiment of the present application.

Based on the above-mentioned multi-channel signal synchronization system, as shown in FIG. 6, a multi-channel signal synchronization method according to an embodiment of the present application is introduced. The multi-channel signal synchronization method may include the following steps.

S610: a clock signal generation module generates and outputs a first clock signal to a synchronization signal generation module.

The introduction of the clock signal generation module 110 and the description of the process of generating and transmitting the first clock signal 103 may refer to the introduction of the clock signal generation module 110 and the first clock signal 103 in the embodiment corresponding to FIG. 1A, which will not be described herein.

S620: the synchronization signal generation module generates a synchronization signal based on the first clock signal and transmits the synchronization signal to the clock signal generation module.

The introduction of the synchronization signal generation module 120 and the process of generating and transmitting the synchronization signal 121 may refer to the introduction of the synchronization signal generation module 120 and the synchronization signal 121 in the embodiment corresponding to FIG. 1A, which will not be described in detail herein.

S630: the clock signal generation module generates a second clock signal according to the synchronization signal and transmits the second clock signal to signal receiving modules.

The process of generating the second clock signal may refer to the introduction of generating the second clock signal in the embodiment corresponding to FIG. 1A, which will not be described in detail herein.

A synchronization signal transmission line is connected between the clock signal generation module and the signal receiving module, so that the clock signal generation module can transmit the second clock signal to each signal receiving module via the synchronization signal transmission lines. The signal receiving modules, after receiving the second clock signal, can implement the effective operation of the sequential circuit based on the second clock signal, so as to complete the corresponding data sampling work.

In another implementation mode, after generating the second clock signal, the clock signal generation module can directly transmit the second clock signal to the signal receiving modules respectively, and each signal receiving module performs delay processing on the second clock signal. The specific delay length can be determined according to the delay lengths corresponding to different signal receiving modules.

As shown in FIG. 4A, a specific example of performing delay processing on the second clock signal by using the signal receiving module is shown. It can be seen that the signal transmitted by the clock signal generation module to each signal receiving module is the same second clock signal, and each signal receiving module delays the second clock signal by itself.

S640: the synchronization signal generation module transmits the synchronization signal to the signal receiving modules to implement the synchronization of the signal receiving modules.

The introduction of the signal receiving modules and the introduction of the synchronization process of the signal receiving modules can be made with reference to the description of the signal receiving modules in the embodiment corresponding to FIG. 1A, which will not be described in detail herein.

In the multi-channel signal synchronization method described above, the execution order of step S630 and step S640 may be exchanged, or step S630 and step S640 may be executed simultaneously. In practical applications, the second clock signal can be transmitted to the signal receiving modules by the clock signal generation module first, and then the synchronization signal is transmitted to the signal receiving modules by the synchronization signal generation module. Or, the synchronization signal can be transmitted to the signal receiving modules by the synchronization signal generation module first, and then the second clock signal is transmitted to the signal receiving modules by the clock signal generation module.

Based on the above-mentioned embodiments of the multi-channel signal synchronization system, circuit, and method, when a synchronization signal is transmitted to signal receiving modules in a multi-channel system, so as to achieve synchronization, the clock signal transmitted to the signal receiving modules can be adjusted based on the synchronization signal, so that the synchronization signal can be transmitted to the signal receiving modules without being interfered by the clock signal when the high level is valid. Accordingly, the timing margin of the adjusted clock signal at the end of synchronization can also meet the requirement of the clock signal for the setup time, so as to be able to respond normally in the signal receiving modules. Therefore, the validity and accuracy of synchronization to the signal receiving modules are ensured.

Another multi-channel signal synchronization system according to an embodiment of the present application will be described below with reference to FIG. 7. The multi-channel signal synchronization system includes a clock signal generation module 110, a synchronization signal generation module 120, and at least two signal receiving modules.

The introduction of the clock signal generation module 110, the synchronization signal generation module 120, and the signal receiving modules may refer to the introduction of the clock signal generation module 110, the synchronization signal generation module 120, and the signal receiving modules in the embodiment corresponding to FIG. 1A, which will not be described in detail herein.

The clock signal generation module 110 may generate a first clock signal 103 and transmit the first clock signal to the synchronization signal generation module 120. After receiving the first clock signal 103, the synchronization signal generation module 120 may generate a synchronization signal 121 and transmit the synchronization signal 121 to the clock signal generation module. The clock signal generation module may generate a second clock signal 111 after receiving the synchronization signal 121. The generation and transmission process of each signal in the above process can be described with reference to the introduction of the generation process of the first clock signal 103, the synchronization signal 121, and the second clock signal and the transmission process of the first clock signal 103 and the synchronization signal 121 in the embodiment corresponding to FIG. 1A, which will not be described in detail herein.

In this embodiment, a synchronization signal transmission line is not connected between the synchronization signal generation module 120 and the signal receiving module, but the synchronization signal 121 is directly transmitted to each signal receiving module through the clock signal generation module 110. In some implementation modes, the synchronization signal 121 and the second clock signal 111 may be transmitted directly by using a mixed signal transmission branch 812.

When the synchronization signal 121 and the second clock signal 111 are transmitted by using the mixed signal transmission branch, the recombination of the second clock signal 111 and the synchronization signal 121 may be firstly performed by using the clock signal generation module 110 based on a preset rule, for example, the second clock signal 111 and the synchronization signal 121 are made to have different clock periods. The signal receiving modules may distinguish the second clock signal 111 and the synchronization signal 121 from a recombined signal based on the preset rule after receiving the recombined signal. For example, in the case where the period of the synchronization signal 121 is greater than that of the second clock signal 111, the recombined signal may exhibit characteristics of a non-periodic signal at the corresponding rising edge and falling edge of the synchronization signal 121, so that a valid signal segment of the synchronization signal 121 may be determined.

Based on the above-mentioned multi-channel signal synchronization system, the synchronization signal line connected between the synchronization signal generation module and each signal receiving module is canceled, and the transmission of the clock signal and the synchronization signal is directly realized by the clock signal generation module using the same signal line, thereby simplifying the design difficulty of the system.

Based on the above-mentioned multi-channel signal synchronization system, a multi-channel signal synchronization circuit according to an embodiment of the present application is described with reference to FIG. 8. The multi-channel signal synchronization circuit according to the embodiment can be applied to or included in the multi-channel signal synchronization system according to the embodiment corresponding to FIG. 7. The multi-channel signal synchronization circuit includes a clock signal generation module 110, a synchronization signal generation module 120, and signal output ports, wherein the signal output port may be the signal receiving module described in the above embodiments, or each of the at least two signal receiving modules may include the signal output port.

Figure 8:
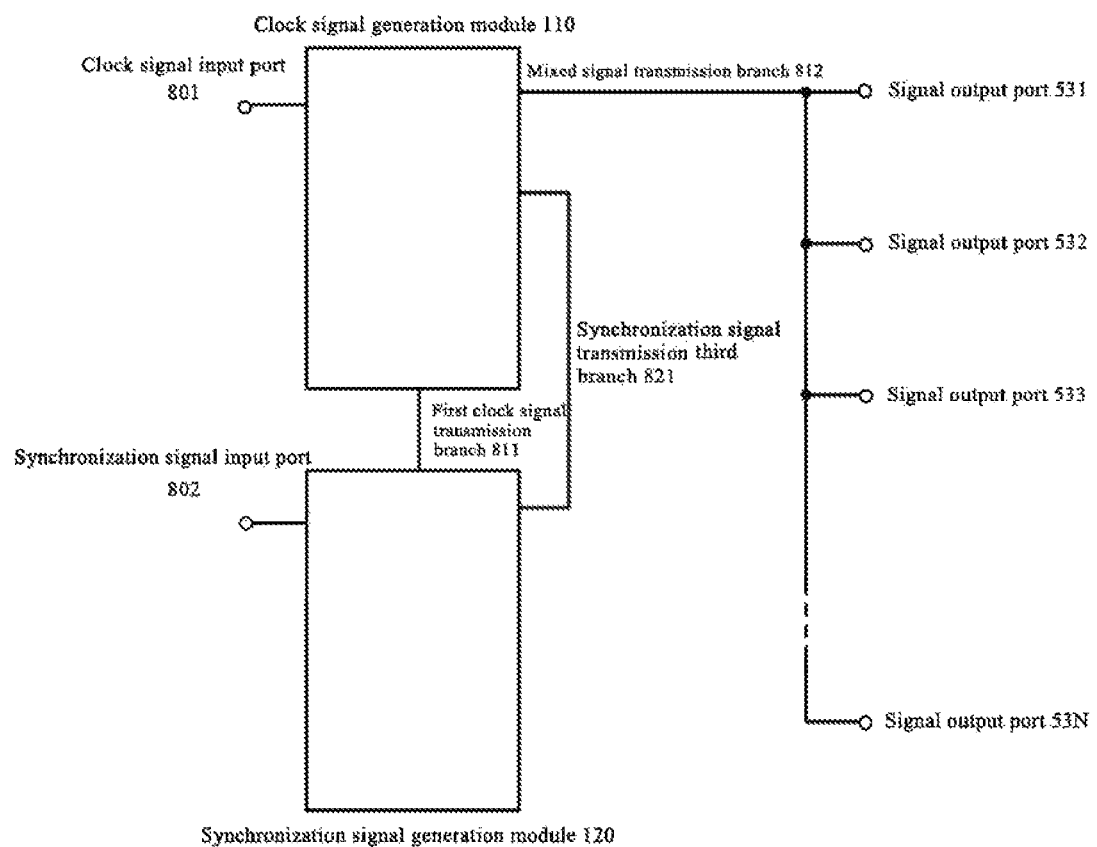
FIG. 8 is a schematic diagram of a multi-channel signal synchronization circuit according to an embodiment of the present application.

In one embodiment, in FIG. 8, a clock signal input port 801 and a synchronization signal input port 802 also exist.

In some implementation modes, when the synchronization signal generation module 120 generates a synchronization signal according to the clock period of the first clock signal, the synchronization signal with a signal validity duration greater than or equal to twice the clock period can be generated. The signal validity duration is the duration of a corresponding signal segment when the synchronization signal is active in the system. For example, when the synchronization signal is valid at high level, the signal validity duration may be the duration for which the high level of the synchronization signal lasts.

A synchronization signal transmission branch may also be provided between the clock signal generation module 110 and the synchronization signal generation module 120. The synchronization signal transmission branch may also be marked as a synchronization signal transmission third branch (i.e., a third branch for synchronization signal transmission) 821, so that the synchronization signal generation module 120 transmits the synchronization signal to the clock signal generation module 110 via the synchronization signal transmission third branch.

The synchronization signal transmission third branch 821 and the first clock signal transmission branch 811 are merely distinguished from a functional point of view. In practical applications, the synchronization signal transmission third branch 821 and the first clock signal transmission branch 811 may be the same signal line or may be different signal lines.

The clock signal generation module 110, after receiving the synchronization signal, may generate a second clock signal based on the synchronization signal.

In some implementation modes, the clock signal generation module 110 may generate the second clock signal by generating an intermediate clock signal based on the received reference clock signal and generating the second clock signal based on the synchronization signal and the intermediate clock signal.

A mixed signal transmission branch 812 may be provided between the clock signal generation module 110 and the signal output port, so that the clock signal generation module 110 transmits the second clock signal and the synchronization signal to the signal output port via the mixed signal transmission branch 812.

The signal output port may transmit the second clock signal and the synchronization signal to a module connected to the signal output port outside the circuit. For example, in the case where the signal output port is connected to an analog-to-digital converter, the second clock signal can be transmitted to the analog-to-digital converter to implement the normal data sampling operation of the analog-to-digital converter, the synchronization signal may also be transmitted to the analog-to-digital converter via the signal output port to enable the synchronization of analog-to-digital converters corresponding to different signal output ports. In practical applications, any module that operates on the basis of a clock signal and needs to be synchronized may be connected to the signal output port.

Figure 7:
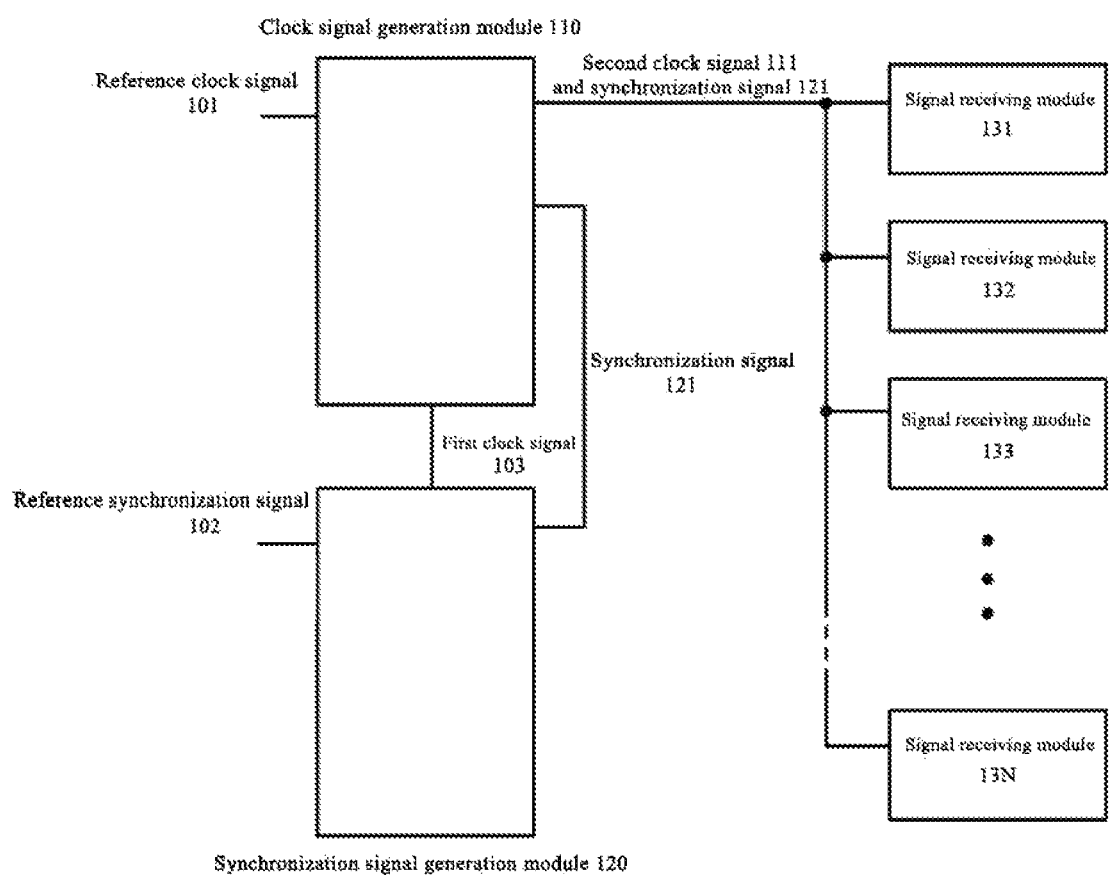
FIG. 7 is a schematic diagram of a multi-channel signal synchronization system according to an embodiment of the present application.
Figure 9:
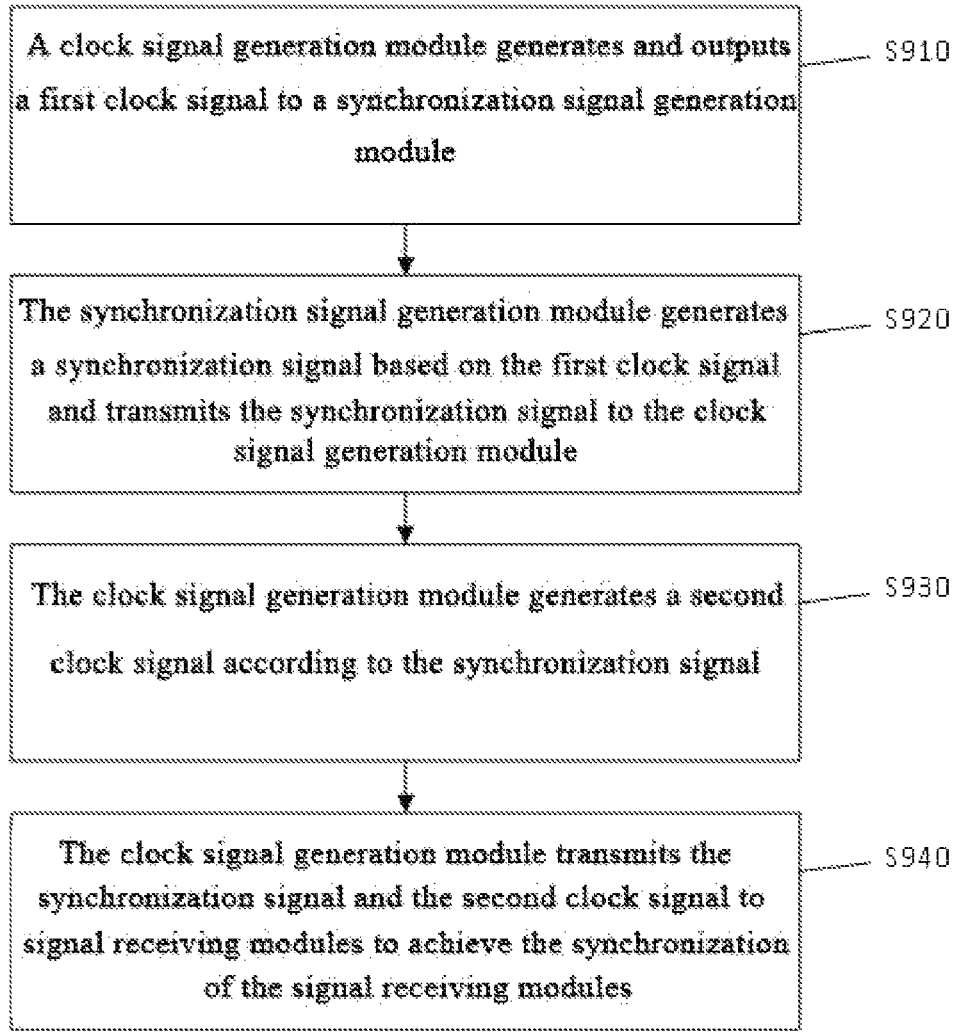
FIG. 9 is a flowchart of a multi-channel signal synchronization method according to an embodiment of the present application.

Based on the multi-channel signal synchronization system corresponding to FIG. 7, as shown in FIG. 9, a multi-channel signal synchronization method according to an embodiment of the present application is introduced. The multi-channel signal synchronization method may include the following steps.

S910: a clock signal generation module generates and outputs a first clock signal to a synchronization signal generation module.

The introduction of the clock signal generation module 110 and the description of the process of generating and transmitting the first clock signal 103 may refer to the introduction of the clock signal generation module 110 and the first clock signal 103 in the embodiment corresponding to FIG. 7, which and will not be described herein.

S920: the synchronization signal generation module generates a synchronization signal based on the first clock signal and transmits the synchronization signal to the clock signal generation module.

The introduction of the synchronization signal generation module 120 and the process of generating and transmitting the synchronization signal 121 may refer to the introduction of the synchronization signal generation module 120 and the synchronization signal 121 in the embodiment corresponding to FIG. 7, which will not be described in detail herein.

S930: the clock signal generation module generates a second clock signal based on the synchronization signal.

The process of generating the second clock signal 111 may refer to the introduction of generating the second clock signal 111 in the embodiment corresponding to FIG. 7, which will not be described in detail herein.

A synchronization signal transmission line is connected between the clock signal generation module and the signal receiving module, so that the clock signal generation module can transmit the second clock signal to each signal receiving module via the synchronization signal transmission lines. The signal receiving modules, after receiving the second clock signal, can implement the effective operation of the sequential circuit based on the second clock signal, so as to complete the corresponding data sampling work.

In an implementation mode, after generating the second clock signal, the clock signal generation module can directly transmit the second clock signal to the signal receiving modules respectively, and each signal receiving module performs delay processing on the second clock signal. The specific delay length can be determined according to the delay lengths corresponding to different signal receiving modules.

S940: the clock signal generation module transmits the synchronization signal and the second clock signal to the signal receiving modules to implement the synchronization of the signal receiving modules.

The introduction of the signal receiving modules and the introduction of the process of transmitting the synchronization signal and the second clock signal can be made with reference to the corresponding description in the embodiment corresponding to FIG. 7, which will not be described herein.

The clock signal generation module can directly transmit the synchronization signal received previously to the signal receiving modules, without the synchronization signal generation module transmitting the synchronization signal to the signal receiving modules, and further without providing signal lines between the synchronization signal generation module and the signal receiving modules. In one implementation mode, the synchronization signal and the second clock signal may be transmitted by directly using the same mixed signal transmission branch.

Based on the above-mentioned multi-channel signal synchronization system, the synchronization signal transmission second branch connected between the synchronization signal generation module and each signal receiving module is canceled, and the transmission of the clock signal and the synchronization signal is directly realized by the clock signal generation module using the mixed signal transmission branch, thereby simplifying the design difficulty of the system.

In some implementation modes, the signal receiving module includes an analog-to-digital converter.

In some implementation modes, the clock signal generation module is configured to generate the first clock signal based on the received reference clock signal.

In some implementation modes, the first clock signal corresponds to a clock period, and the synchronization signal has a signal validity duration greater than or equal to twice the clock period.

In some implementation modes, the clock signal generation module is configured to generate an intermediate clock signal based on the received reference clock signal, and to generate a second clock signal based on the intermediate clock signal and the synchronization signal.

In some implementation modes, the clock signal generation module is configured to input the synchronization signal and the intermediate clock signal into a gating clock unit to obtain the second clock signal.

In some implementation modes, the clock signal generation module is configured to delay the synchronization signal and generate the second clock signal according to the delayed synchronization signal and the intermediate clock signal.

In some implementation modes, the clock signal generation module delays the synchronization signal by using the first clock signal;

and/or, the clock signal generation module delays the synchronization signal by using a resistor-capacitor delay unit;

and/or, the clock signal generation module delays the synchronization signal by using a buffer.

In some implementation modes, the synchronization signal generation module is configured to generate a synchronization signal based on the first clock signal and the received reference synchronization signal.

In some implementation modes, the signal receiving module corresponds to a specified delay length;

the clock signal generation module is configured to perform delay processing corresponding to the delay length of the signal receiving module on the second clock signal after generating the second clock signal, and to transmit the delayed second clock signal to the signal receiving modules.

In some implementation modes, the signal receiving module corresponds to a specified delay length;

the clock signal generation module is configured to respectively transmit the second clock signal to the signal receiving modules after generating the second clock signal;

the signal receiving module is configured to perform delay processing corresponding to the delay length on the received second clock signal.

In some implementation modes, the first clock signal transmission branch is the same branch as the synchronization signal transmission first branch.

Based on the above-mentioned embodiments of the multi-channel signal synchronization system, circuit, and method, when a synchronization signal is transmitted to signal receiving modules in a multi-channel system to achieve synchronization, the clock signal transmitted to the signal receiving modules is adjusted based on the synchronization signal, so that the synchronization signal can be transmitted to the signal receiving modules without being interfered by the clock signal when the high level is valid. Accordingly, after the clock signal is adjusted, the timing margin at the end of the synchronization can also meet the requirement for setup time, so as to enable a normal response in the signal receiving modules. In addition, using the mixed signal transmission branch to realize the transmission of the clock signal and the synchronization signal at the same time also reduces lines in the design and reduces the design difficulty. Therefore, the multi-channel signal synchronization system, circuit, and method conveniently and accurately achieve the synchronization of the signal receiving modules in the multi-channel system.

It can be seen from the technical solutions provided by the above-mentioned embodiments of the present application that the multi-channel signal synchronization system introduced by the embodiments of the present application generates a second clock signal according to a synchronization signal, so that a correlation exists between the second clock signal and the synchronization signal. When the synchronization signal is used to synchronize the signal receiving modules, the second clock signal received by the signal receiving modules will not cause interference to the synchronization signal. After the synchronization process is completed, the clock signal in each channel can also take effect normally, thus ensuring the correct operation of the signal receiving modules, reducing the difficulty of signal synchronization for a multi-channel system, and conveniently and effectively achieving multi-channel signal synchronization.

For the same and similar parts of the various embodiments in the present application, references may be made to each other, and each embodiment focuses on the differences from other embodiments. In particular, for the system embodiments, since they are basically similar to the method embodiments, the description on the system embodiments is relatively simple, and regarding the related parts, please refer to the description of the method embodiments.

What is claimed is:

1. A multi-channel signal synchronization system, comprising a clock signal generation module, a synchronization signal generation module, and at least two signal receiving modules, wherein
    the clock signal generation module is configured to generate a first clock signal and transmit the first clock signal to the synchronization signal generation module;
    the synchronization signal generation module is configured to generate a synchronization signal based on the first clock signal output by the clock signal generation module, and to transmit the synchronization signal to the clock signal generation module;
    the clock signal generation module is further configured to generate a second clock signal based on the synchronization signal fed back by the synchronization signal generation module, and to transmit the second clock signal to the at least two signal receiving modules; and
    the synchronization signal generation module is further configured to transmit the synchronization signal to the at least two signal receiving modules,
    wherein the clock signal generation module is configured to generate an intermediate clock signal according to a received reference clock signal and generate a second clock signal according to the intermediate clock signal and the synchronization signal, and
    wherein the clock signal generation module is configured to input the synchronization signal and the intermediate clock signal into a gating clock unit to obtain the second clock signal.

2. The system according to claim 1, wherein the clock signal generation module is configured to delay the synchronization signal, and to generate the second clock signal according to the delayed synchronization signal and the intermediate clock signal.

3. The system according to claim 1, wherein the synchronization signal generation module is configured to generate a synchronization signal based on the first clock signal and a received reference synchronization signal.

4. The system according to claim 1, wherein each of the at least two signal receiving modules comprises a signal output port, wherein the system further comprises:
    a first clock signal transmission branch and a synchronization signal transmission first branch provided between the clock signal generation module and the synchronization signal generation module, wherein the first clock signal transmission branch is configured to transmit the first clock signal generated by the clock signal generation module to the synchronization signal generation module, and the synchronization signal transmission first branch is configured to transmit the synchronization signal generated by the synchronization signal generation module to the clock signal generation module;
    a second clock signal transmission branch provided between the clock signal generation module and the signal output port, wherein the second clock signal transmission branch is configured to transmit the second clock signal generated by the clock signal generation module to the signal output port, and the clock signal generation module is configured to generate the second clock signal based on the received synchronization signal and the first clock signal; and
    a synchronization signal transmission second branch provided between the synchronization signal generation module and the signal output port, wherein synchronization signal transmission second branch is configured to transmit the synchronization signal generated by the synchronization signal generation module to the signal output port.

5. A multi-channel signal synchronization system, comprising a clock signal generation module, a synchronization signal generation module, and at least two signal receiving modules, wherein
    the clock signal generation module is configured to generate a first clock signal and transmit the first clock signal to the synchronization signal generation module;
    the synchronization signal generation module is configured to generate a synchronization signal based on the first clock signal output by the clock signal generation module, and to transmit the synchronization signal to the clock signal generation module; and
    the clock signal generation module is further configured to generate a second clock signal based on the synchronization signal fed back by the synchronization signal generation module, and to transmit the synchronization signal and the second clock signal to the at least two signal receiving modules,
    wherein the clock signal generation module is configured to generate an intermediate clock signal according to a received reference clock signal, and to generate a second clock signal according to the intermediate clock signal and the synchronization signal, and
    wherein the clock signal generation module is configured to input the synchronization signal and the intermediate clock signal into a gating clock unit to obtain the second clock signal.

6. The system according to claim 5, wherein the clock signal generation module is configured to delay the synchronization signal, and to generate the second clock signal according to the delayed synchronization signal and the intermediate clock signal.

7. The system according to claim 5, wherein the synchronization signal generation module is configured to generate the synchronization signal based on the first clock signal and a received reference synchronization signal.

8. The system according to claim 5, wherein each of the at least two signal receiving modules comprises a signal output port, wherein the system further comprises:

a first clock signal transmission branch and a synchronization signal transmission branch provided between the clock signal generation module and the synchronization signal generation module, wherein the first clock signal transmission branch is configured to transmit the first clock signal generated by the clock signal generation module to the synchronization signal generation module, and the synchronization signal transmission branch is configured to transmit the synchronization signal generated by the synchronization signal generation module to the clock signal generation module; and a mixed signal transmission branch provided between the clock signal generation module and the signal output port, wherein the mixed signal transmission branch is configured to transmit the second clock signal generated by the clock signal generation module and the synchronization signal received by the clock signal generation to the signal output port.

9. A multi-channel signal synchronization method, comprising:

generating, by a clock signal generation module, a first clock signal, and outputting the first clock signal to a synchronization signal generation module;

generating, by the synchronization signal generation module, a synchronization signal based on the first clock signal, and transmitting the synchronization signal to the clock signal generation module;

generating, by the clock signal generation module, an intermediate clock signal according to a received reference clock signal;

generating, by the clock signal generation module, a second clock signal by inputting the synchronization signal and the intermediate clock signal into a gating clock unit, and transmitting the second clock signal to at least two signal receiving modules; and transmitting, by the synchronization signal generation module, the synchronization signal to the at least two signal receiving modules to achieve synchronization of the at least two signal receiving modules.

10. A multi-channel signal synchronization method, comprising:

generating, by a clock signal generation module, a first clock signal, and outputting the first clock signal to a synchronization signal generation module;

generating, by the synchronization signal generation module, a synchronization signal based on the first clock signal, and transmitting the synchronization signal to the clock signal generation module;

generating, by the clock signal generation module, an intermediate clock signal according to a received reference clock signal;

generating, by the clock signal generation module, a second clock signal by inputting the synchronization signal and the intermediate clock signal into a gating clock unit; and transmitting, by the clock signal generation module, the synchronization signal and the second clock signal to at least two signal receiving modules to achieve synchronization of the at least two signal receiving modules.

* * * * *